United States Patent
Kurose et al.

(10) Patent No.: US 7,171,641 B2
(45) Date of Patent: Jan. 30, 2007

(54) VOLTAGE CHANGE REFLECTING DELAY CALCULATION METHOD, AND VOLTAGE CHANGE REFLECTING DELAY CALCULATION SYSTEM

(75) Inventors: Shinichi Kurose, Kawasaki (JP); Seiji Goto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 396 days.

(21) Appl. No.: 10/345,989

(22) Filed: Jan. 17, 2003

(65) Prior Publication Data

US 2003/0182637 A1 Sep. 25, 2003

(30) Foreign Application Priority Data

Mar. 19, 2002 (JP) ............... 2002-075481

(51) Int. Cl.
*G06F 17/50* (2006.01)
(52) U.S. Cl. ............................. 716/6; 716/8
(58) Field of Classification Search .......... 716/1, 716/4
See application file for complete search history.

(56) References Cited

U.S. PATENT DOCUMENTS

2004/0153985 A1* 8/2004 Paul et al. ............... 716/10

FOREIGN PATENT DOCUMENTS

JP 2000-99554 A 4/2000

OTHER PUBLICATIONS

I-Min Liu et al, Integrated Power Supply Planning and Floorplanning, Proceedings of the ASP-DAC 2001, pp. 589-594, Jan. 30, 2001.*

* cited by examiner

*Primary Examiner*—Leigh M. Garbowski
(74) *Attorney, Agent, or Firm*—Staas & Halsey LLP

(57) ABSTRACT

A method for designing a semiconductor integrated circuit is proposed. The semiconductor integrated circuit includes power supply terminals each formed out of an area bump and signal terminals. Distance from the logic cell or the module to a power supply area bump closest thereto is obtained for the logic cell or the module. Further, a power supply voltage which is estimated to be actually applied to the logic cell or the module is obtained based on the obtained distance and a power supply voltage applied to the power supply area bump. Finally, a delay is calculated based on the estimated power supply voltage.

24 Claims, 6 Drawing Sheets

VOLTAGE CHANGE REFLECTING DELAY CALCULATION METHOD, AND VOLTAGE CHANGE REFLECTING DELAY CALCULATION SYSTEM

CROSS-REFERENCE TO RELATED APPLICATIONS

This application is based upon and claims the benefit of priority from the prior Japanese Patent Application No. 2002-075481, filed on Mar. 19, 2002, the entire contents of which are incorporated herein by reference.

BACKGROUND OF THE INVENTION

1. Field of the Invention

The present invention relates to a technology of calculate a delay in designing a semiconductor integrated circuit by estimating a change in a power supply voltage which is estimated to be actually applied to a logic cell or a module based on a distance to a power supply area bump closest to the logic cell or the module and a power supply voltage applied to the power supply area bump for each logic cell or module.

2. Description of the Related Art

Generally, a voltage applied to each logic cell in a semiconductor integrated circuit is lower than a voltage applied to a power supply source, depending on the position at which the logic cell is arranged, the distance of the logic cell from the power supply source or the like. This is caused by voltage change which derives from a wiring parasitic element such as a resistance or a capacitance. The magnitude of the voltage to be applied to each logic cell is one of the important factors which influence the delay of the cell. Therefore, it is important to design the semiconductor integrated circuit not by uniformly applying the voltage of the power supply source to all logic cells but by reflecting the influence of the voltage change of each logic cell.

If the semiconductor integrated circuit is designed without consideration to the influence of voltage change, the error between a delay which is obtained by calculation in a design phase and a measured delay in an actual circuit becomes greater, which causes disadvantages such as the need to redesign the semiconductor integrated circuit. If a semiconductor integrated circuit is to be designed under a design rule of less than 0.5 µm, called "deep submicron", in particular, it is necessary to fully consider the influence of the voltage change of each logic cell.

Two methods are conventionally known for calculating a delay which reflects the influence of the voltage change of each logic cell as follows. The first method is to calculate a delay by extracting a parasitic element of a power supply wiring which connects a power supply terminal to a logic circuit using layout data and process parameters and by multiplying delay time by a power supply voltage or current coefficient which is calculated based on the extracted parasitic element. The second method is to obtain a delay by applying a maximum or minimum voltage change for an entire chip.

The first method, however, has the following disadvantages. It takes a lot of time to perform calculation, design TAT (Turn Around Time) considerably increases, and it is, therefore, impractical to apply the first method to actual circuit design. The second method has the following disadvantages. If the maximum voltage change is used, the semiconductor integrated circuit is designed under excessive conditions, making it difficult to converge design steps. If the minimum voltage change is used, a margin becomes insufficient, with the result that some circuits malfunction. If so, it takes a long time to analyze the malfunction and yield deteriorates. Therefore, whichever is selected, the maximum or the minimum, design TAT increases.

SUMMARY OF THE INVENTION

It is an object of this invention to provide a voltage change reflecting delay calculation method and a voltage change reflecting delay calculation system which can obtain a delay which reflects the influence of the voltage change of each logic cell or module while minimizing an increase in design TAT.

According to the present invention, in designing a semiconductor integrated circuit which includes power supply terminals each formed out of an area bump and signal terminals, a distance from the logic cell or the module to a power supply area bump closest thereto is obtained for each logic cell or module, a power supply voltage which is estimated to be actually applied to the logic cell or the module is obtained based on the obtained distance and a power supply voltage applied to the power supply area bump, and a delay according to the estimated power supply voltage is obtained.

According to the above aspect, a change in a power supply voltage which is actually applied to a logic cell or module is estimated based on a distance between the logic cell or the module and a power supply area bump. Therefore, it is possible to obtain a delay which reflects the influence of the voltage change of each logic cell or module while minimizing an increase in design TAT.

These and other objects, features and advantages of the present invention are specifically set forth in or will become apparent from the following detailed descriptions of the invention when read in conjunction with the accompanying drawings.

DETAILED DESCRIPTIONS

Embodiments of the present invention will be explained hereinafter in detail with reference to the accompanying drawings.

Figure 1:
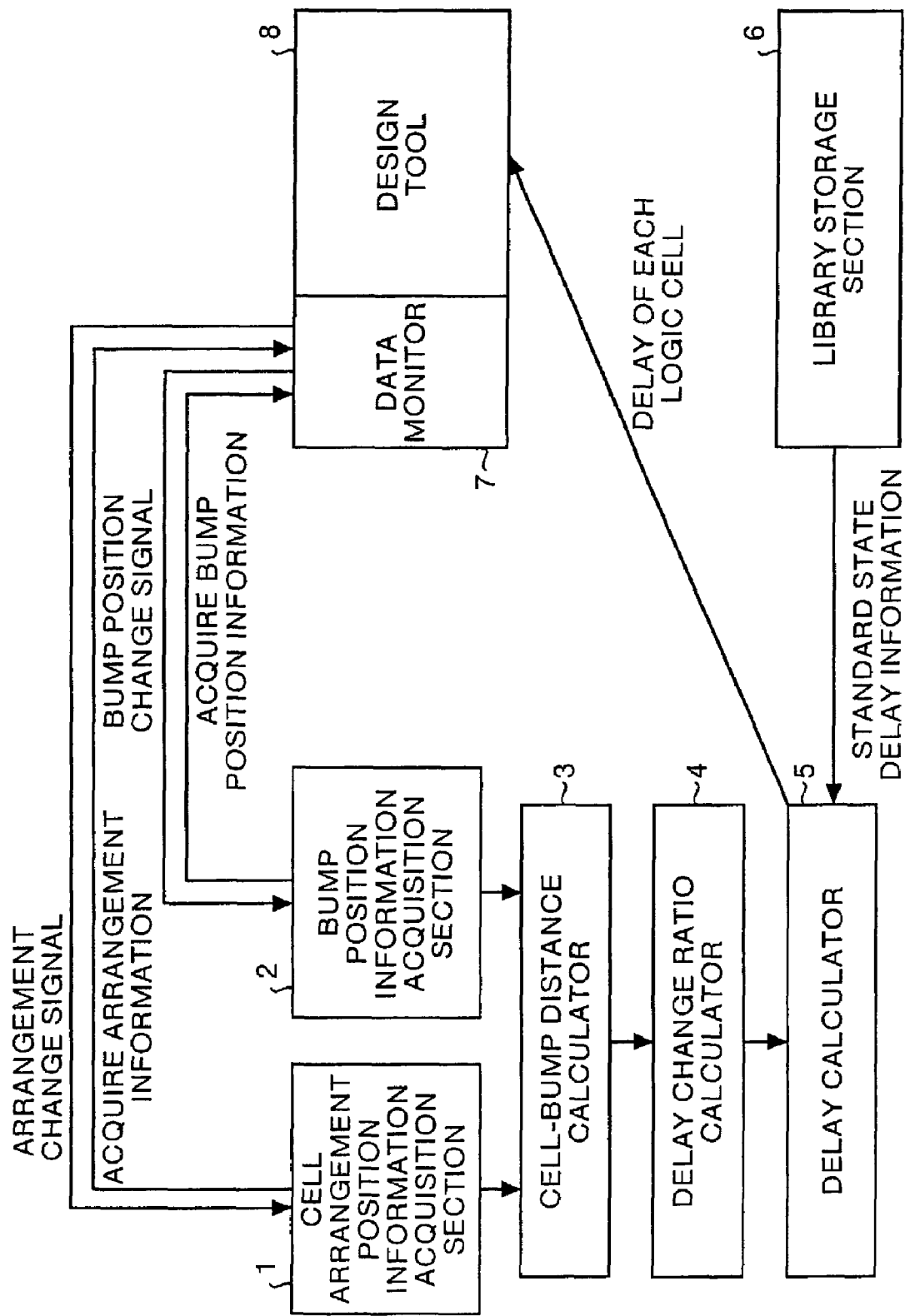
FIG. 1 is a schematic diagram that shows the configuration of a voltage change reflecting delay calculation system for executing a voltage change reflecting delay calculation method in a first embodiment according to the present invention.

FIG. 1 is a schematic diagram that shows the configuration of a voltage change reflecting delay calculation system for executing a voltage change reflecting delay calculation method in a first embodiment according to the present invention. This system includes a cell arrangement position information acquisition section 1, a bump position information acquisition position 2, a cell-bump distance calculator 3, a delay change ratio calculator 4, a delay calculator 5, a library storage section 6, and a data monitor 7.

The cell arrangement position information acquisition section 1 acquires information on the arrangement position of each logic cell in a circuit in a design tool 8, and stores the acquired information. The bump position information acquisition section 2 acquires information on the position of a bump in a circuit in the design tool 8, and stores the acquired information. The cell-bump distance calculator 3 calculates the distance between each logic cell and an area bump closest to the logic cell for each logic cell based on the logic cell arrangement position information and the power supply area bump position information which are stored in the cell arrangement position information acquisition section 1 and the bump position information acquisition section 2, respectively.

The delay change ratio calculator 4 calculates a change ratio to a standard delay ("delay change ratio") based on the distance which is calculated by the cell-bump distance calculator 3 and a power supply voltage applied to the power supply area bump for each logic cell. The standard delay is preset as a delay in a standard state and stored in the library storage section 6. The standard state means a state in which it is assumed that the same power supply voltage as that of the power supply area bump is applied to a logic cell. The delay calculator 5 calculates a delay based on the delay change ratio which is calculated by the delay change ratio calculator 4 and the standard delay for each logic cell.

The data monitor 7 transmits a signal to the cell arrangement position information acquisition section 1 or the bump position information acquisition section 2 in response to a change in a cell arrangement position or a bump position, thereby notifies the section 1 or 2 of the change. This is because the cell arrangement position or the bump position is often changed according to an individual processing (logic optimization or physical optimization).

Figure 3:
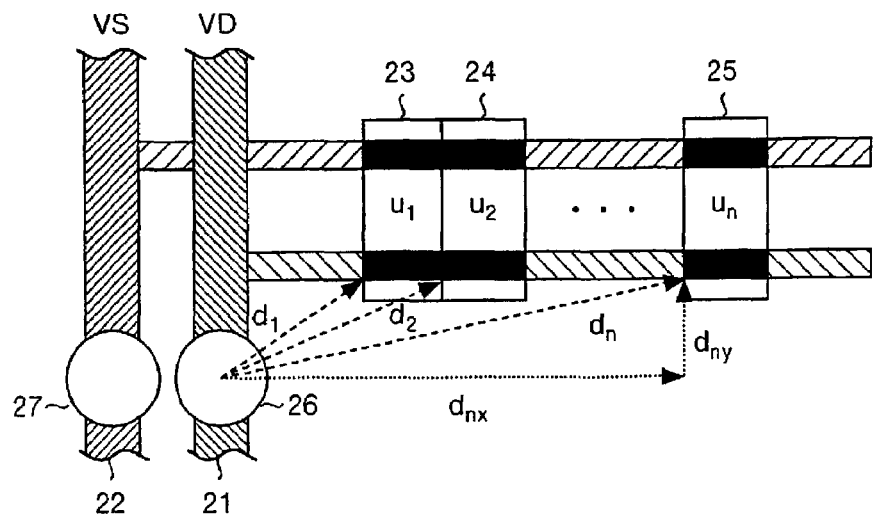
FIG. 3 is a typical view which shows the neighborhood of an area bump to explain the voltage change reflecting delay calculation method in the first embodiment according to the present invention.

A method for calculating the delay change ratio P by the delay change ratio calculator 4 will next be explained. As shown in FIG. 3, a plurality of logic cells ($u_1$, $u_2$, ... and $u_n$) 23, 24 and 25 are arranged along a pair of a power supply voltage-side wiring 21 and a ground voltage-side wiring 22, and distances between the logic cells 23, 24 and 25 of $u_1$, $u_2$ and $u_n$ and a power supply-side power supply area bump 26 closest thereto are expressed by $d_1$, $d_2$ and $d_n$, respectively. Symbol n is a natural number. In addition, if the distance $d_i$ (where i is a natural number not greater than n) is considered while being divided to an x-direction component and a y-direction component in an xy coordinate system, an x-direction distance is expressed by $d_{ix}$ and a y-direction distance is expressed by $d_{iy}$.

The delay change ratio P is calculated by one of the following methods (1) to (4). It is assumed herein that a power supply voltage applied to the power supply voltage-side power supply area bump 26 is VD and a ground voltage which is applied to a ground voltage-side power supply area bump 27 is VS. It is also assumed herein that a constant related to the calculation of the delay change ratio is $\alpha$, and the constants of the x component and the y component related to the calculation of the delay change ratio are $\alpha_x$ and $\alpha_y$, respectively.

(1) Method by using the logic cell $u_i$, the distance $d_i$ between the logic cell $u_i$ and the power supply area bump closest thereto and the constant $\alpha$, According to this method, $\alpha$ is constant irrespective of $d_i$. The delay change ratio P is obtained by the following equation.

$$P = d_i \times \alpha \times (VD - VS)$$

(2) Method by using the constant $\alpha$ according to the range of the distance $d_i$ between the logic cell $u_i$ and the power supply area bump closest thereto, According to this method, $\alpha$ varies according to the range of $d_i$. For example, if $d_i \geq 1000$, $\alpha = 1.6$; if $1000 > d_i \geq 500$, $\alpha = 1.5$; and if $d_i < 500$, $\alpha = 1.2$. The delay change ratio P is obtained by the following equation.

$$P = \alpha \times (VD - VS)$$

(3) Method by using the x-direction distance $d_{ix}$ and y-direction distance $d_{iy}$ between the logic cell $u_i$ and the power supply area bump closest thereto, the x component constant $\alpha_x$ and the y component constant $\alpha_y$, According to this method, $\alpha_x$ and $\alpha_y$ are constant irrespective of $d_{ix}$ and $d_{iy}$, respectively. The delay change ratio P is obtained by the following equation.

$$P = (d_{ix} \times \alpha_x + d_{iy} \times \alpha_y) \times (VD - VS)$$

(4) Method by using the x component constant $\alpha_x$ according to the range of the x-direction distance $d_{ix}$ and the y component constant $\alpha_y$ according to the range of the y-direction distance $d_{iy}$ between the logic cell $u_i$ and the power supply area bump closest thereto, According to this method, $\alpha_x$ and $\alpha_y$ vary according to the ranges $d_{ix}$ and $d_{iy}$, respectively. For example, if $d_{ix} \geq 1000$, $\alpha_x = 1.6$; if $1000 > d_{ix} \geq 500$, $\alpha_x = 1.5$; and if $d_{ix} < 500$, $\alpha_x = 1.2$. In addition, if $d_{iy} \geq 1000$, $\alpha_y = 1.7$; if $1000 > d_{iy} \geq 500$, $\alpha_y = 1.5$; and if $d_{iy} < 500$, $\alpha_y = 1.1$. The delay change ratio P is obtained by the following equation.

$$P = (\alpha_x + \alpha_y) \times (VD - VS)$$

Figure 2:
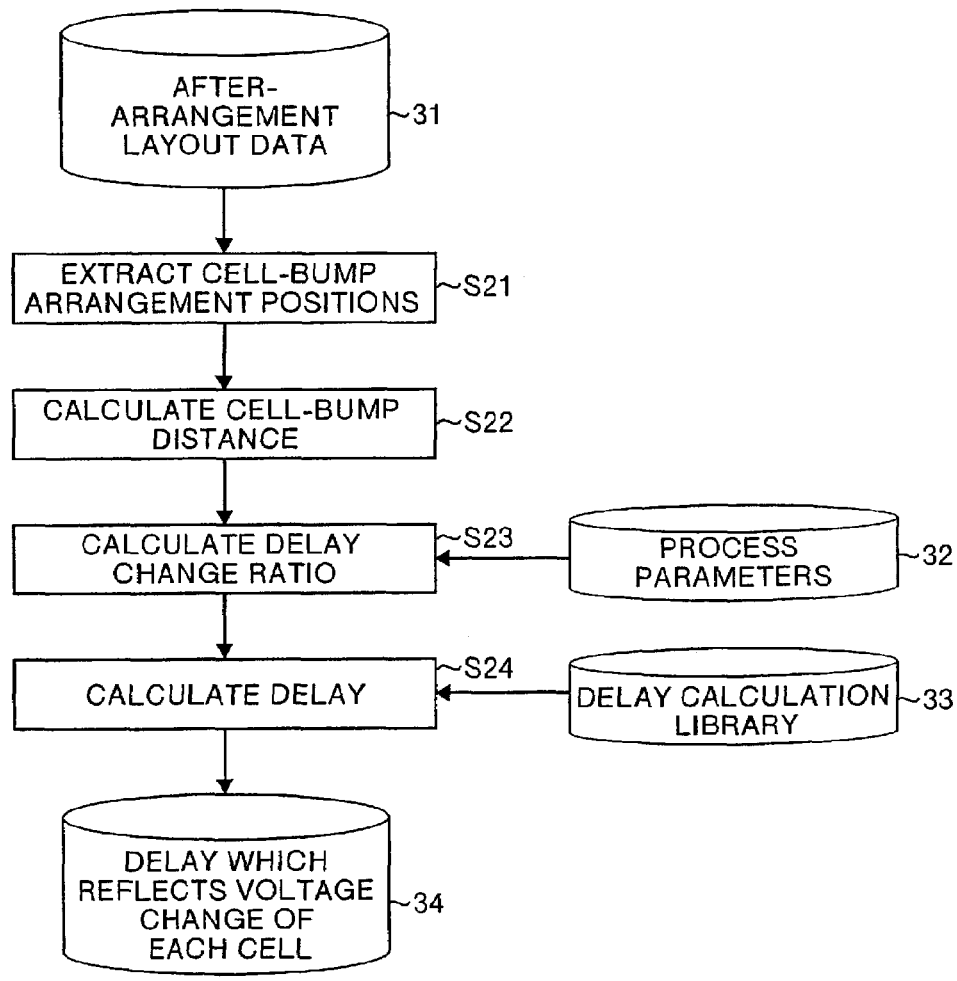
FIG. 2 is a flowchart which shows processing procedures for the voltage change reflecting delay calculation method in the first embodiment according to the present invention.

FIG. 2 is a flow chart which shows processing procedures for the voltage change reflecting delay calculation method in the first embodiment according to the present invention. The arrangement position of each logic cell and the position of each power supply area bump are extracted from after-arrangement layout data 31 (at step S21). Based on information on the extracted logic cell arrangement position and the extracted power supply area bump position, the distance $d_i$ (which may be $d_{ix}$ and $d_{iy}$) between each logic cell and the power supply area bump closest thereto is calculated for each logic cell (at step S22). To calculate the distance and to select the closest power supply area bump, an ordinary two-dimensional coordinate system method using xy coordinates of each logic cell and each power supply area bump is available.

The power supply voltage VD, the ground voltage VS, the constants such as $\alpha$, $\alpha_x$ and $\alpha_y$ are received as process parameters 32, and the delay change ratio P of each logic cell is calculated using the distance $d_i$ or $d_{ix}$ and $d_{iy}$ calculated at the step S22 by one of the methods (1) to (4) (at step S23). The standard delay is calculated from the delay calculation library 33, and the delay of each logic cell is calculated using the delay change ratio P calculated at the step S23 (at step S24). As a result, a delay 34 which reflects voltage change is obtained for each logic cell.

The after-arrangement layout data 31 and the process parameters 32 are supplied from the design tool 8 in the system shown in FIG. 1. In addition, the delay calculation library 33 is stored in the library storage section 6 in the system shown in FIG. 1. Further, the delay 34 which is obtained by the calculation of the delay at the step S24 is supplied to the design tool 8 and, as will be explained later, used as the delay of each logic cell in processings performed while using the delays in the design flow of a semiconductor integrated circuit which includes power supply terminals each formed out of an area bump and signal terminals.

The reason for limiting the shape of the power supply terminal to the shape of an area bump is as follows. In a semiconductor integrated circuit which does not include an area bump, a power supply terminal is arranged around a chip. In a semiconductor integrated circuit which includes power supply terminals each formed out of an area bump and signal terminals, by contrast, power supply area bumps are arranged on the surface of a chip almost equidistantly. Therefore, an average distance from the power supply area bumps to the respective logic cells is short, so that the accuracy of the calculated values can be maintained in this embodiment in which the delay is calculated using the distance from each logic cell to the power supply area bump as a parameter.

The processings performed while using the delays in the design flow will be explained. The processings include, for example, a layout processing for placement and routing followed by timing driven in a physical design processing, a timing verification processing after the layout processing and the like in a design system using a CAD tool. In a addition, the processings include a logic synthesis optimization processing or the like in a logic design processing.

Figure 4:
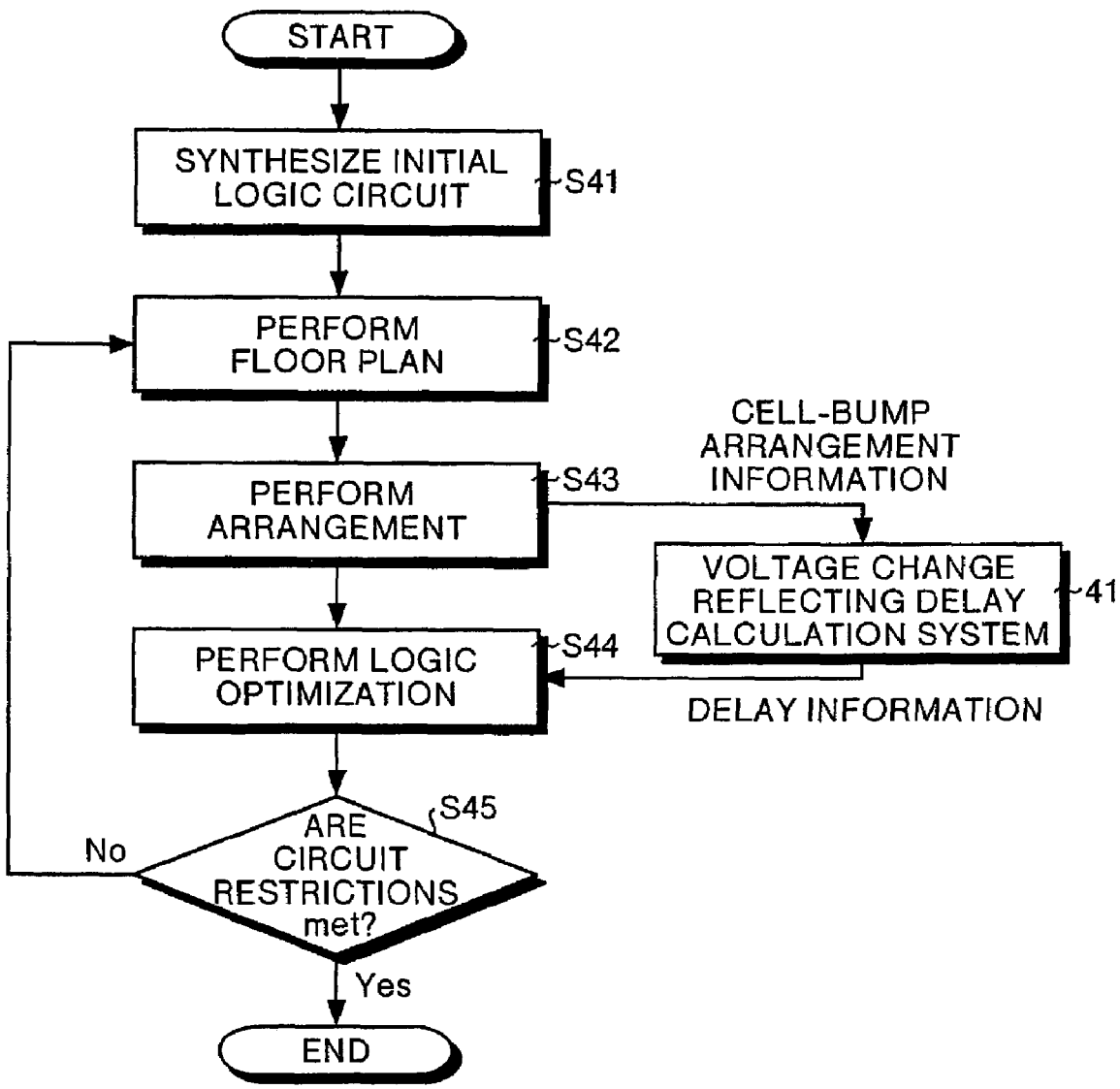
FIG. 4 is a flowchart which shows procedures for a logic design processing to which the voltage change reflecting delay calculation method in the first embodiment according to the present invention is applied.

FIG. 4 is a flowchart which shows procedures for the logic design processing. If a logic design processing starts, an initial logic circuit synthesis processing is performed for a module (at step S41). A floor plan processing is then performed (at step S42) and a logic cell arrangement processing is performed (at step S43). Based on the logic cell arrangement position information and the power supply area bump position information, the voltage change reflecting delay calculation method shown in FIG. 2 is executed by the voltage change reflecting delay calculation system 41 shown in FIG. 1, to obtain a delay which reflects the voltage change of each logic cell and to perform a logic optimization processing using the delay (at step S44). The floor plan, arrangement and logic optimization processings are repeated until the optimized result meets circuit restrictions. If the optimized result meets the circuit restrictions, the logic design processing is finished.

Figure 5:
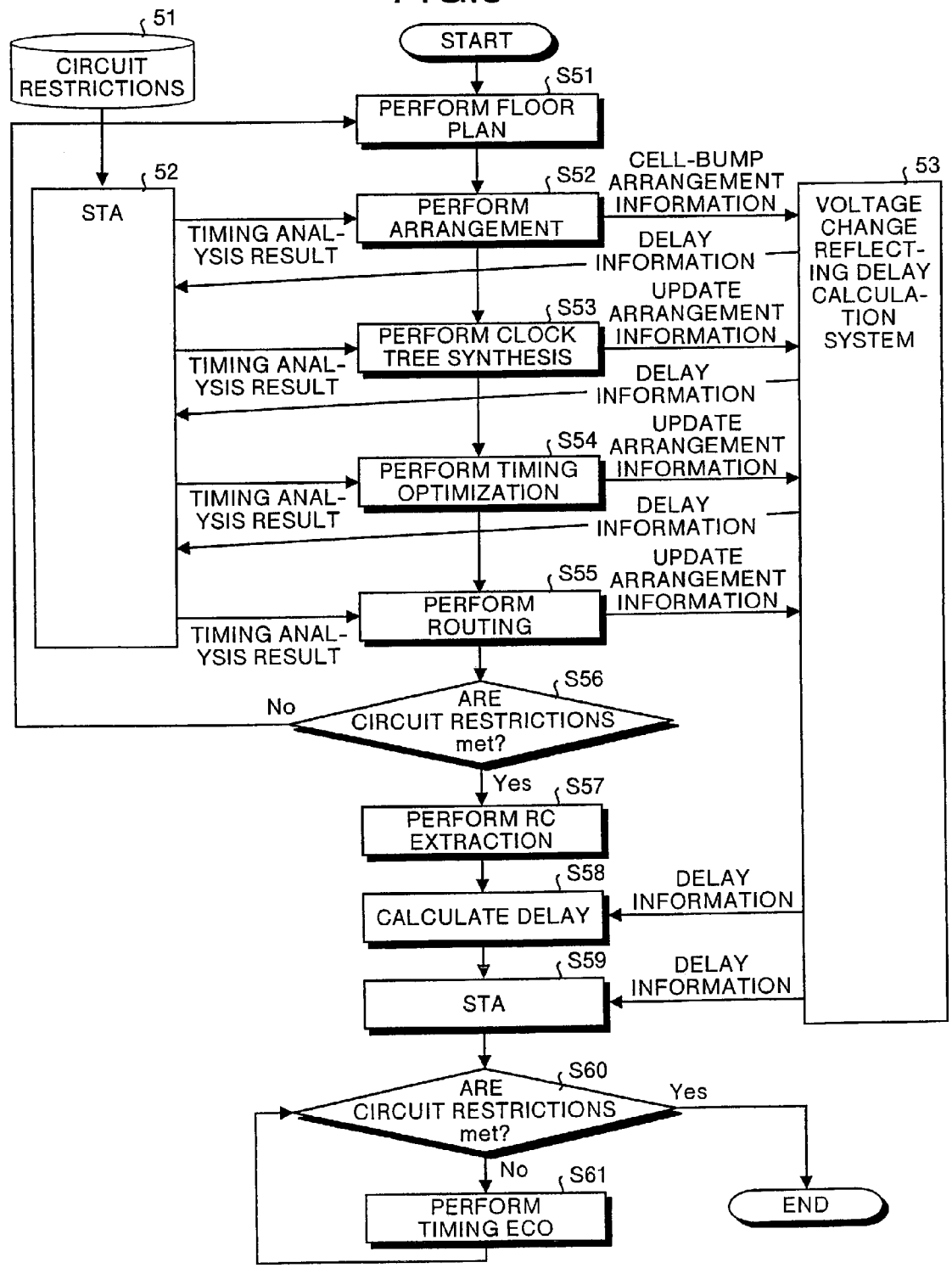
FIG. 5 is a flowchart which shows procedures for a physical design processing to which the voltage change reflecting delay calculation method in the first embodiment according to the present invention is applied.

FIG. 5 is a flowchart which shows procedures for the physical design processing. If a physical design processing starts, a floor plan processing is performed (at step S51). Using the restriction information which is obtained by a static timing analysis performed by a static timing analysis tool (STA) 52 based on circuit restrictions 51, a logic cell arrangement processing is performed (at step S52). Based on the logic cell arrangement position information and the power supply area bump position information, the voltage change reflecting delay calculation method shown in FIG. 2 is executed by the voltage change reflecting delay calculation system 53 shown in FIG. 1, to obtain a delay which reflects the voltage change of each logic cell. Based on the delay information thus obtained, the static timing analysis tool 52 performs a static timing analysis again.

Using the restriction information which is newly obtained by the static timing analysis, the static timing analysis tool 52 performs a clock tree synthesis processing (at step S53). At this time, the logic cell arrangement position and the power supply area bump position are sometimes changed. The voltage change reflecting delay calculation method is executed again by the voltage change reflecting delay calculation system 53 based on the updated information of the position information, to newly obtain a delay which reflects the voltage change of each logic cell. Based on the delay information thus obtained, the static timing analysis tool 52 performs a static timing analysis again.

Using the latest restriction information which is obtained by the static timing analysis, a timing optimization processing is performed (at step S54). Based on the updated information on the logic cell arrangement position and the power supply area bump position, the voltage change reflecting delay calculation method is executed again by the voltage change reflecting delay calculation system 53, to newly obtain a delay which reflects the voltage change of each logic cell. Based on the delay information thus obtained, the static timing analysis tool 52 performs a static timing analysis again.

Using the latest restriction information obtained by the static timing analysis, a routing processing is performed (at step S55). Based on the latest information on the logic cell arrangement position and the power supply area bump position, the voltage change reflecting delay calculation method is executed again by the voltage change reflecting delay calculation system 53, to newly obtain a delay which reflects the voltage change of each logic cell.

After the routing processing, if the circuit restrictions are not met ('No' at the step S56), the floor plan processing at the step S51 and the following are performed again. If the circuit restrictions are met ('Yes' at the step S56), an RC extraction processing is performed (at step S57). Based on the latest delay obtained by the voltage change reflecting delay calculation system 53, a delay calculation is performed (at step S58). Based on the latest delay obtained by the voltage change reflecting delay calculation system 53, a static timing analysis is performed (at step S59).

As a result of the analysis, if the circuit restrictions are not met ('No' at step S60), a timing ECO (Engineering Change Order) processing is performed until the circuit restrictions are met (at step S61). If the circuit restrictions are met ('Yes' at the step S60), the physical design processing is finished.

According to the first embodiment, the delay change ratio is obtained based on the distance between each logic cell and the power supply area bump closest thereto and on the power supply voltage applied to the voltage area bump, and an actual delay relative to the standard delay is calculated using the delay change ratio. It is, therefore, possible to obtain the delay of each logic cell which reflects the influence of a change in the power supply voltage which is actually applied to the logic cell. At this time, only the two parameters, i.e., the distance from each logic cell to the power supply area bump and the power supply voltage of the power supply area bump are employed. It is, therefore, possible to minimize an increase in design TAT.

According to the first embodiment, a semiconductor integrated circuit can be designed for each logic cell using a delay according to a power supply voltage. Therefore, the error of the delay of an actual circuit from the calculated delay which is obtained in the design phase can be made small and operation faults can be minimized. It is, therefore, possible to improve yield, to decrease fault analysis time and time required to redesign the circuit and to thereby shorten design TAT.

Figure 6:
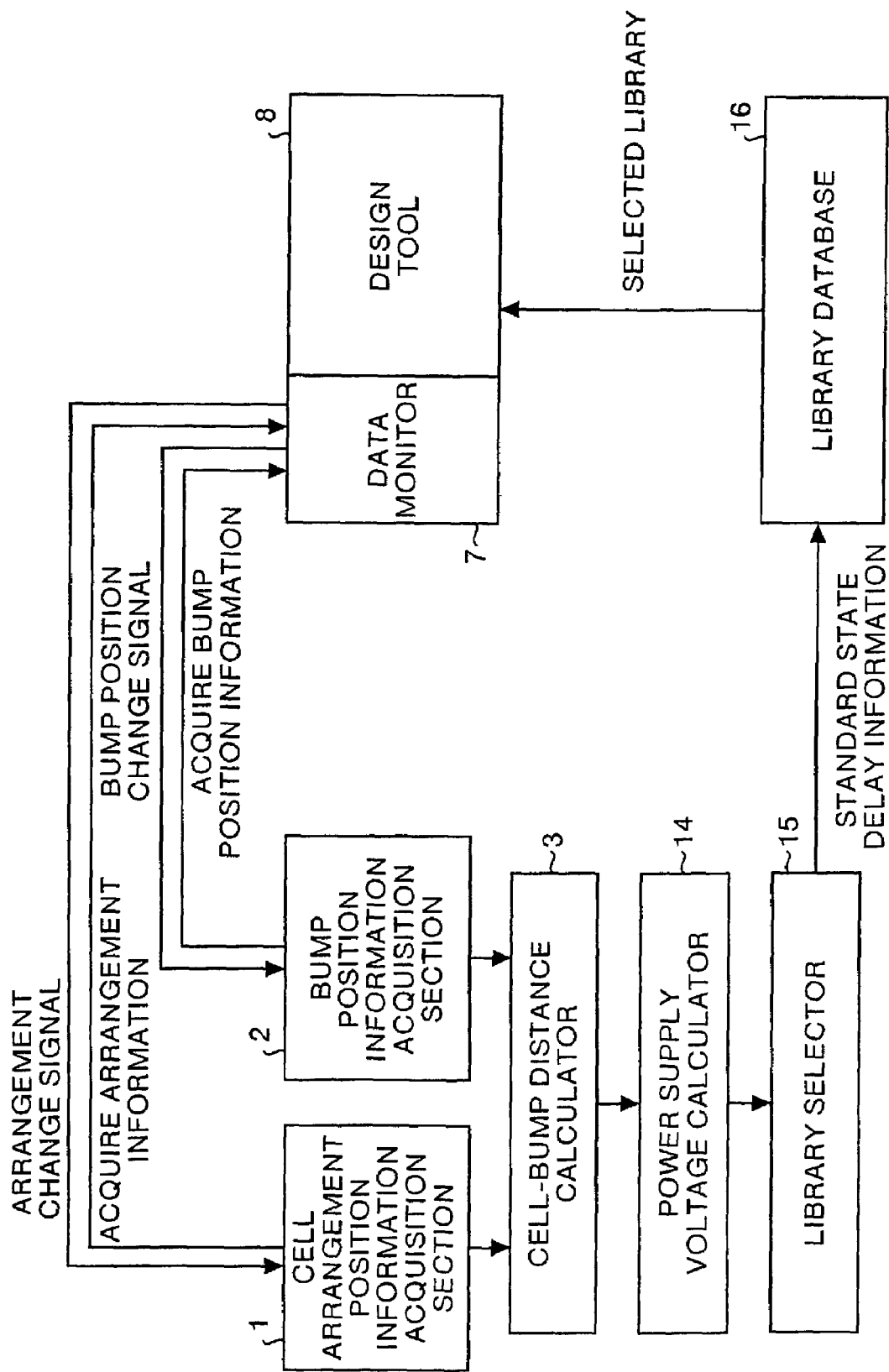
FIG. 6 is a schematic diagram that shows the configuration of a voltage change reflecting delay calculation system for executing a voltage change reflecting delay calculation method in a second embodiment according to the present invention.

FIG. 6 is a schematic diagram that shows a voltage change reflecting delay calculation system for executing voltage change reflecting delay calculation method in a second embodiment according to the present invention. This system includes a cell arrangement position information acquisition section 1, a bump position information acquisition section 2, a cell-bump distance calculator 3, a power supply voltage calculator 14, a library selector 15, a library database 16 and a data monitor 7. The same constituent elements as those in the first embodiment are denoted by the same reference symbols, respectively and will not be explained herein.

The power supply voltage calculator 14 calculates and obtains a power supply voltage which is actually applied to each logic cell based on the distance which is calculated by the cell-bump distance calculator 3 and on the power supply voltage applied to each power supply area bump, for each logic cell. The library selector 15 selects a library which is used by each logic cell based on the power supply voltage which is actually applied to the logic cell and which is calculated by the power supply voltage calculator 14, for each logic cell. The library database 16 stores a library having information on logic cells which correspond to various power supply voltages and the delays of the logic cells. The library database 16 supplies a necessary library to a design tool based on a select signal which is fed from the library selector 15.

A method for calculating a power supply voltage $V_{ui}$ by the power supply voltage calculator 14 will next be explained. The power supply voltage $V_{ui}$ which is actually applied to each logic cell is calculated by one of the following methods (5) to (8). It is assumed herein that a change in the power supply voltage which is actually applied to each logic cell relative to the power supply voltage applied to the power supply area bump is $\Delta V$. It is also assumed herein, that a constant related to a distance to the power supply voltage is $\beta$, and an x component constant and a y component constant related to the distance to the power supply voltage are $\beta_x$ and $\beta_y$, respectively. The symbols $d_i$, $d_{ix}$, $d_{iy}$, VD and VS are the same as those explained in the first embodiment.

(5) Method by using the logic cell $u_i$, the distance $d_i$ between the logic cell $u_i$ and the power supply area bump closest thereto and the constant $\beta$, According to this method, $\beta$ is constant irrespective of $d_i$. The power supply voltage $V_{ui}$ of the logical cell is obtained by the following two equations:

$$\Delta V = d_i \times \beta \times (VD - VS)$$

$$V_{ui} = VD + \Delta V.$$

(6) Method by using the constant $\beta$ according to the range of the distance $d_i$ between the logic cell $u_i$ and the power supply area bump closest thereto, According to this method, $\beta$ varies according to the range of $d_i$. For example, if $d_i \geq 1000$, $\beta=1.6$; if $1000 > d_i \geq 500$, $\beta=1.5$; and if $d_i < 500$, $\beta=1.2$. The power supply voltage $V_{ui}$ is obtained by the following two equations:

$$\Delta V = \beta \times (VD - VS)$$

$$V_{ui} = VD + \Delta V.$$

(7) Method by using the x-direction distance $d_{ix}$ and y-direction distance $d_{iy}$ between the logic cell $u_i$ and the power supply area bump closest thereto, the x component constant $\beta_x$ and the y component constant $\beta_y$, According to this method, $\beta_x$ and $\beta_y$ are constant irrespective of $d_{ix}$ and $d_{iy}$, respectively. The power supply voltage $V_{ui}$ of the logic cell is obtained by the following two equations:

$$\Delta V = (d_{ix} \times \beta_x + d_{iy} \times \beta_y) \times (VD - VS)$$

$$V_{ui} = VD + \Delta V.$$

(8) Method by using the x component constant $\beta_x$ according to the range of the x-direction distance $d_{ix}$ and they component constant $\beta_y$ according to the range of the y-direction distance $d_{iy}$ between the logic cell $u_i$ and the power supply area bump closest thereto, According to this method, $\beta_x$ and $\beta_y$ vary according to the ranges of $d_{ix}$ and $d_{iy}$, respectively. For example, if $d_{ix} \geq 1000$, $\beta_x = 1.6$; if $1000 > d_{ix} \geq 500$, $\beta_x = 1.5$; and if $d_{ix} < 500$, $\beta_x = 1.2$. In addition, if $d_{iy} \geq 1000$, $\beta_y = 1.7$; if $1000 > d_{iy} \geq 500$, $\beta_y = 1.5$; and if $d_{iy} < 500$, $\beta_y = 1.1$. The power supply voltage $V_{ui}$ of the logic cell is obtained by the following two equations:

$$\Delta V = (\beta_x + \beta_y) \times (VD - VS)$$

$$V_{ui} = VD + \Delta V.$$

Figure 7:
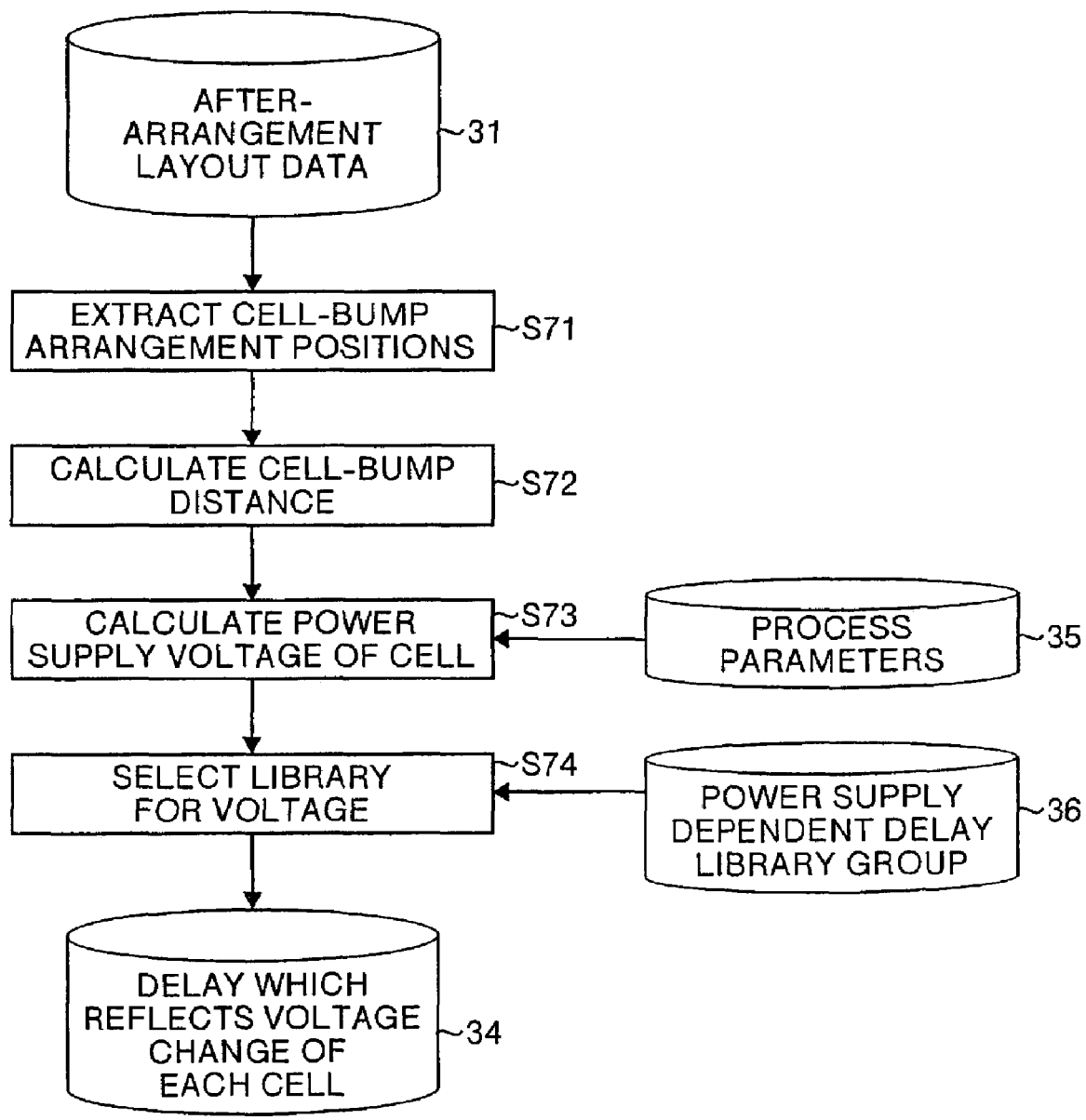
FIG. 7 is a flowchart which shows processing procedures for the voltage change reflecting delay calculation method in the second embodiment according to the present invention.

FIG. 7 is a flowchart which shows processing procedures for the voltage change reflecting delay calculation method in the second embodiment according to the present invention. The arrangement position of each logic cell and the position of each power supply area bump are extracted from after-arrangement layout data 31 (at step S71). Based on information on the extracted logic cell arrangement position and the extracted power supply area bump position, the distance $d_i$ (which may be $d_{ix}$ and $d_{iy}$) between each logic cell and the power supply area bump closest thereto is calculated for each logic cell (at step S72). To calculate the distance and to select the closest power supply area bump, an ordinary two-dimensional coordinate system method using xy coordinates of each logic cell and each power supply area bump is available.

The power supply voltage VD, the ground voltage VS, the constants such as $\beta$, $\beta_x$ and $\beta_y$ are received as process parameters 35, and the power supply voltage $V_{ui}$ of each logic cell is calculated using the distance $d_i$ or $d_{ix}$ and $d_{iy}$ calculated at the step S72 by one of the methods (5) to (8) (at step S73). A library which corresponds to the power supply voltage $V_{ui}$ of each logic cell calculated at the step S73 is selected from a power supply dependent delay library group 36 which stores libraries for the power supply voltages of respective logic cells used in a circuit (at step S74) As a result, a delay 34 which reflects the voltage change of each logic cell is obtained based on the delay information allocated to the selected library.

The after-arrangement layout data 31 and the process parameters 35 are supplied from the design tool 8 in the system shown in FIG. 6. In addition, the power supply dependent delay library group 36 corresponds to the library database 16 shown in FIG. 6. Further, the delay 34 is supplied to the design tool 8 and, similarly to the first embodiment, used as the delay of each logic cell in processings performed while using the delays in the design flow of a semiconductor integrated circuit which includes power supply terminals each formed out of an area bump and signal terminals. Since the processings performed while using the delays in the design flow are the same as those explained in the first embodiment, they will not be explained herein.

According to the second embodiment, the power supply voltage of each logic cell is obtained based on the distance between the logic cell and the power supply area bump closest thereto and the power supply voltage applied to the power supply area bump. To select a library which corresponds to the power supply voltage thus obtained, it is possible to obtain the delay of each logic cell which reflects the influence of a change in a power supply voltage which is actually applied to the logic cell while minimizing an increase in design TAT.

The present invention explained so far is not limited to the embodiments but various changes and modifications can be made. In addition, the present invention may be applied to, for example, the initial logic circuit synthesis in the logic design processing shown in FIG. 4. In that case, the logic cell may be changed to a module in the above explanation.

According to the present invention, a change in the power supply voltage which is actually applied to each logic cell or module is estimated based on the distance between the logic cell or the module and the power supply area bump. It is, therefore, possible to obtain a delay which reflects the influence of voltage change for each logic cell or module while minimizing an increase in design TAT.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A delay calculation method for calculating a cell delay due to a drop in a cell voltage applied to a logic cell included in a semiconductor integrated circuit with a plurality of power supply area bumps, wherein the power supply area bumps for power supply arranged on the semiconductor integrated circuit at substantially regular intervals, the delay calculation method comprising:
receiving layout data of the semiconductor integrated circuit from a computer-implemented design tool;
identifying a position of the logic cell and a position of a closest power supply area bump that is closest to the logic cell based on the layout data;
calculating a distance between the logic cell and the closest power supply area bump based on the position of the logic cell and the position of the closest power supply area bump; and
calculating a change ratio of the cell delay based on the distance and a source voltage applied to the closest power supply area bump.

2. The delay calculation method according to claim 1, further comprising selecting a coefficient corresponding to the distance from among a plurality of coefficients, wherein the change ratio is calculated based on the coefficient.

3. The delay calculation method according to claim 1, wherein
the calculating includes calculating a first distance between the logic cell and the closest power supply area bump in a first direction of a two dimensional coordinate system and a second distance between the logic cell and the closest power supply area bump in a second direction of the two dimensional coordinate system, and
the change ratio is calculated based on the first distance and the second distance.

4. The delay calculation method according to claim 3, further comprising selecting a first coefficient corresponding to the first distance and a second coefficient corresponding to the second distance from among a plurality of coefficients, wherein
the change ratio is calculated based on the first coefficient and the second coefficient.

5. A delay calculation method for calculating a cell delay due to a drop in a cell voltage applied to a logic cell included in a semiconductor integrated circuit with a plurality of power supply area bumps, wherein the power supply area bumps are bumps for power supply arranged on the semiconductor integrated circuit at substantially regular intervals, the delay calculation method comprising:
receiving layout data of the semiconductor integrated circuit from a computer-implemented design tool;
identifying a position of the logic cell and a position of a closest power supply area bump that is closest to the logic cell based on the layout data;
calculating a distance between the logic cell and the closest power supply area bump based on the position of the logic cell and the position of the closest power supply area bump;
calculating a cell voltage applied to the logic cell based on the distance and a source voltage applied to the closest power supply area bump; and
selecting, as the cell delay, a delay value corresponding to the cell voltage from among a plurality of delay values stored in a database.

6. The delay calculation method according to claim 5, further comprising selecting a coefficient corresponding to the distance from among a plurality of coefficients, wherein the cell voltage is calculated based on the coefficient.

7. The delay calculation method according to claim 5, wherein
the calculating includes calculating a first distance between the logic cell and the closest power supply area bump in a first direction of a two dimensional coordinate system and a second distance between the logic cell and the closest power supply area bump in a second direction of the two dimensional coordinate system, and
the cell voltage is calculated based on the first distance and the second distance.

8. The delay calculation method according to claim 7, further comprising selecting a first coefficient corresponding to the first distance and a second coefficient corresponding to the second distance from among a plurality of coefficients, wherein
the cell voltage is calculated based on the first coefficient and the second coefficient.

9. A delay calculation system that calculates a cell delay due to a drop in a cell voltage applied to a logic cell included in a semiconductor integrated circuit with a plurality of power supply area bumps, wherein the power supply area bumps are bumps for power supply arranged on the semiconductor integrated circuit at substantially regular intervals, the delay calculation system comprising:
a layout-data receiving unit that receives layout data of the semiconductor integrated circuit from a computer-implemented design tool;
a position identifying unit that identifies a position of the logic cell and a position of a closest power supply area bump that is closest to the logic cell based on the layout data;
a distance calculating unit that calculates a distance between the logic cell and the closest power supply area bump based on the position of the logic cell and the position of the closest power supply area bump; and a change-ratio calculating unit that calculates a change ratio of the cell delay based on the distance and a source voltage applied to the closest power supply area bump.

10. The delay calculation system according to claim 9, further comprising a notifying unit that notifies a change in the layout data to the position identifying unit.

11. The delay calculation system according to claim 9, further comprising a coefficient selecting unit that selects a coefficient corresponding to the distance from among a plurality of coefficients, wherein the change ratio is calculated based on the coefficient.

12. The delay calculation system according to claim 9, wherein the distance calculating unit calculates a first distance between the logic cell and the closest power supply area bump in a first direction of a two dimensional coordinate system and a second distance between the logic cell and the closest power supply area bump in a second direction of the two dimensional coordinate system, and the change ratio is calculated based on the first distance and the second distance.

13. The delay calculation system according to claim 12, further comprising a coefficient selecting unit that selects a first coefficient corresponding to the first distance and a second coefficient corresponding to the second distance from among a plurality of coefficients, wherein the change ratio is calculated based on the first coefficient and the second coefficient.

14. A delay calculation system for calculating a cell delay due to a drop in a cell voltage applied to a logic cell included in a semiconductor integrated circuit with a plurality of power supply area bumps, wherein the power supply area bumps are bumps for power supply arranged on the semiconductor integrated circuit at substantially regular intervals, the delay calculation system comprising:

a layout-data receiving unit that receives layout data of the semiconductor integrated circuit from a computer-implemented design tool;

a position identifying unit that identifies a position of the logic cell and a position of a closest power supply area bump that is closest to the logic cell based on the layout data;

a distance calculating unit that calculates a distance between the logic cell and the closest power supply area bump based on the position of the logic cell and the position of the closest power supply area bump;

a cell-voltage calculating unit that calculates a cell voltage applied to the logic cell based on the distance and a source voltage applied to the closest power supply area bump; and a delay-value selecting unit that selects, as the cell delay, a delay value corresponding to the cell voltage from among a plurality of delay values stored in a database.

15. The delay calculation system according to claim 14, further comprising a notifying unit that notifies a change in the layout data to the position identifying unit.

16. The delay calculation system according to claim 14, further comprising a coefficient selecting unit that selects a coefficient corresponding to the distance from among a plurality of coefficients, wherein the cell voltage is calculated based on the coefficient.

17. The delay calculation system according to claim 14, wherein the distance calculating unit calculates a first distance between the logic cell and the closest power supply area bump in a first direction of a two dimensional coordinate system and a second distance between the logic cell and the closest power supply area bump in a second direction of a two dimensional coordinate system, and the cell voltage is calculated based on the first distance and the second distance.

18. The delay calculation system according to claim 17, further comprising a coefficient selecting unit that selects a first coefficient corresponding to the first distance and a second coefficient corresponding to the second distance from among a plurality of coefficients, wherein the cell voltage is calculated based on the first coefficient and the second coefficient.

19. A method for designing a semiconductor integrated circuit that includes a logic cell and a plurality of power supply area bumps, wherein the power supply area bumps are bumps for power supply arranged on the semiconductor integrated circuit at substantially regular intervals, the method comprising:

calculating a cell delay due to a drop in a cell voltage applied to the logic cell; and performing layout processing for the semiconductor integrated circuit based on the cell delay, wherein the calculating includes receiving layout data of the semiconductor integrated circuit from a computer-implemented design tool;

identifying a position of the logic cell and a position of a closest power supply area bump that is closest to the logic cell based on the layout data;

calculating a distance between the logic cell and the closest power supply area bump based on the position of the logic cell and the position of the closest power supply area bump; and calculating a change ratio of the cell delay based on the distance and a source voltage applied to the closest power supply area bump.

20. A method for designing a semiconductor integrated circuit that includes a logic cell and a plurality of power supply area bumps, wherein the power supply area bumps are bumps for power supply arranged on the semiconductor integrated circuit at substantially regular intervals, the method comprising:

calculating a cell delay due to a drop in a cell voltage applied to the logic cell; and performing layout processing for the semiconductor integrated circuit based on the cell delay, wherein the calculating includes receiving layout data of the semiconductor integrated circuit from a computer-implemented design tool;

identifying a position of the logic cell and a position of a closest power supply area bump that is closest to the logic cell based on the layout data;

calculating a distance between the logic cell and the closest power supply area bump based on the position of the logic cell and the position of the closest power supply area bump;

calculating a cell voltage applied to the logic cell based on the distance and a source voltage applied to the closest power supply area bump; and selecting, as the cell delay, a delay value corresponding to the cell voltage from among a plurality of delay values stored in a database.

21. A method for designing a semiconductor integrated circuit that includes a logic cell and a plurality of power supply area bumps, wherein the power supply area bumps are bumps for power supply arranged on the semiconductor integrated circuit at substantially regular intervals, the method comprising:

calculating a cell delay due to a drop in a cell voltage applied to the logic cell; and
performing timing verification processing for the semiconductor integrated circuit based on the cell delay, wherein the calculating includes
receiving layout data of the semiconductor integrated circuit from a computer-implemented design tool;
identifying a position of the logic cell and a position of a closest power supply area bump that is closest to the logic cell based on the layout data;
calculating a distance between the logic cell and the closest power supply area bump based on the position of the logic cell and the position of the closest power supply area bump; and
calculating a change ratio of the cell delay based on the distance and a source voltage applied to the closest power supply area bump.

22. A method for designing a semiconductor integrated circuit that includes a logic cell and a plurality of power supply area bumps, wherein the power supply area bumps are bumps for power supply arranged on the semiconductor integrated circuit at substantially regular intervals, the method comprising:

calculating a cell delay due to a drop in a cell voltage applied to the logic cell; and
performing timing verification processing for the semiconductor integrated circuit based on the cell delay, wherein the calculating includes
receiving layout data of the semiconductor integrated circuit from a computer-implemented design tool;
identifying a position of the logic cell and a position of a closest power supply area bump that is closest to the logic cell based on the layout data;
calculating a distance between the logic cell and the closest power supply area bump based on the position of the logic cell and the position of the closest power supply area bump;
calculating a cell voltage applied to the logic cell based on the distance and a source voltage applied to the closest power supply area bump; and
selecting, as the cell delay, a delay value corresponding to the cell voltage from among a plurality of delay values stored in a database.

23. A method for designing a semiconductor integrated circuit that includes a logic cell and a plurality of area bumps, wherein the power supply area bumps are bumps for power supply arranged on the semiconductor integrated circuit at substantially regular intervals, the method comprising:

calculating a cell delay due to a drop in a cell voltage applied to the logic cell;
performing any one of a floor plan and a placement or both for the semiconductor integrated circuit based on the cell delay; and
performing logic optimization processing for the semiconductor integrated circuit by feed-backing any one of a result of the floor plan and a result of the placement or both, wherein the calculating includes
receiving layout data of the semiconductor integrated circuit from a computer-implemented design tool;
identifying a position of the logic cell and a position of a closest power supply area bump that is closest to the logic cell based on the layout data;
calculating a distance between the logic cell and the closest power supply area bump based on the position of the logic cell and the position of the closest power supply area bump; and
calculating a change ratio of the cell delay based on the distance and a source voltage applied to the closest power supply area bump.

24. A method for designing a semiconductor integrated circuit that includes a logic cell and a plurality of power supply area bumps, wherein the power supply area bumps are bumps for power supply arranged on the semiconductor integrated circuit at substantially regular intervals, the method comprising:

calculating a cell delay due to a drop in a cell voltage applied to the logic cell;
performing any one of a floor plan and a placement or both for the semiconductor integrated circuit based on the cell delay; and
performing logic optimization processing for the semiconductor integrated circuit by feed-backing any one of a result of the floor plan and a result of the placement or both, wherein the calculating includes
receiving layout data of the semiconductor integrated circuit from a computer-implemented design tool;
identifying a position of the logic cell and a position of a closest power supply area bump that is closest to the logic cell based on the layout data;
calculating a distance between the logic cell and the closest power supply area bump based on the position of the logic cell and the position of the closest power supply area bump;
calculating a cell voltage applied to the logic cell based on the distance and a source voltage applied to the closest power supply area bump; and
selecting, as the cell delay, a delay value corresponding to the cell voltage from among a plurality of delay values stored in a database.

* * * * *